(12) United States Patent
Wu et al.

(10) Patent No.: US 7,675,309 B2
(45) Date of Patent: Mar. 9, 2010

(54) PROBING SYSTEM FOR INTEGRATED CIRCUIT DEVICE

(75) Inventors: Cheng Wen Wu, Hsinchu (TW); Chih Tsun Huang, Hsinchu (TW); Yu Tsao Hsing, Taipei County (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/424,969

(22) Filed: Apr. 16, 2009

(65) Prior Publication Data

US 2009/0201039 A1    Aug. 13, 2009

Related U.S. Application Data

(63) Continuation-in-part of application No. 12/114,768, filed on May 3, 2008, and a continuation of application No. 11/203,380, filed on Aug. 12, 2005, now abandoned.

(51) Int. Cl.
*G01R 31/02* (2006.01)
*G01R 31/28* (2006.01)
(52) U.S. Cl. .................................... 324/763; 324/158.1
(58) Field of Classification Search .................. None
See application file for complete search history.

*Primary Examiner*—Ha Tran T Nguyen
*Assistant Examiner*—Roberto Velez
(74) *Attorney, Agent, or Firm*—WPAT, P.C.; Anthony King

(57) ABSTRACT

A probing system for integrated circuit device, which transmits testing data/signal between an automatic test equipment (ATE) and an integrated circuit device, is disclosed. The probing system comprising a test head having a first transceiving module; a test station having a test unit couple to the test head to perform test operation; a communication module having a second transceiving module configured to exchange data with the first transceiving module; an integrated circuit device having at least one core circuit being tested; and at least one test module having a self-test circuit couple to the core circuit and the communication module for performing the core circuit self-testing.

17 Claims, 13 Drawing Sheets

PROBING SYSTEM FOR INTEGRATED CIRCUIT DEVICE

CROSS-REFERENCE TO A RELATED APPLICATION

This application is a Continuation-In-Part (CIP) Application of U.S. patent application Ser. No. 12/114,768 filed on May 3, 2008, which is a CIP Application of U.S. patent application Ser. No. 11/203,380 filed on Aug. 12, 2005. All of which are hereby incorporated by reference in their entirety.

BACKGROUND OF THE INVENTION

1. Field of the Invention

The present invention relates to a probing system for integrated circuit device.

2. Background

Generally speaking, after an integrated circuit device is manufactured, a testing process is performed to check the electrical properties of the integrated circuit device. The integrated circuit devices that meet the specifications of the electrical properties are selected for the subsequent process, while others that do not meet the specifications are discarded to cut the cost.

The conventional automatic test equipment (ATE) uses probe tips on a probe card to contact signal pads on a device under test (DUT) so as to form a path for transmitting the probing signal from the ATE to the DUT and transmitting the tested electrical parameters from the DUT to the ATE. However, the operation speed of the integrated circuit device such as the transistor increases continuously as semiconductor fabrication technology improves. The conventional technique uses the probe tip to mechanically probe the DUT and therefore its overall time accuracy (OTA) cannot catch up with the DUT with a highly improved operation speed. Consequently, the conventional ATE obviously cannot be used to probe the electrical property of the high-speed integrated circuit device in the future.

SUMMARY OF THE INVENTION

The present invention provides a probing system for integrated circuit device, wherein testing data such as the probing signal and the tested electrical parameter etc. are delivered between a testing machine including a first transceiving module and an integrated circuit device being tested by the testing machine.

The integrated circuit device according to one embodiment of the present invention comprises a core circuit, a self-test circuit electrically connected to the core circuit, a controller configured to control the operation of the self-test circuit, and a second transceiving module configured to exchange testing data with the first transceiving module.

The probing system for integrated circuit device according to another embodiment of the present invention comprises a test head having a first transceiving module and a test station having a test unit couple to the test head to perform test operation. The probing system further comprise a communication module having a second transceiving module configured to exchange data with the first transceiving module in a wireless manner, an integrated circuit device having a core circuit being tested; and a test module having a self-test circuit coupled to the core circuit and the communication module for performing the core circuit self-testing.

The probing system for integrated circuit device according to yet another embodiment of the present invention comprises a test head, a test station and an integrated circuit device. The test head has a first transceiving module. The test station has a test unit coupled to the test head to perform test operation. The integrated circuit device comprises a communication module, a plurality of core circuits being tested and at least one test module, wherein each core circuit is manufactured in one die. The communication module has a second transceiving module configured to exchange data with the first transceiving module. The communication module, the plurality of core circuits and the test module are packaged in one package.

DETAILED DESCRIPTION OF THE INVENTION

Figure 1:
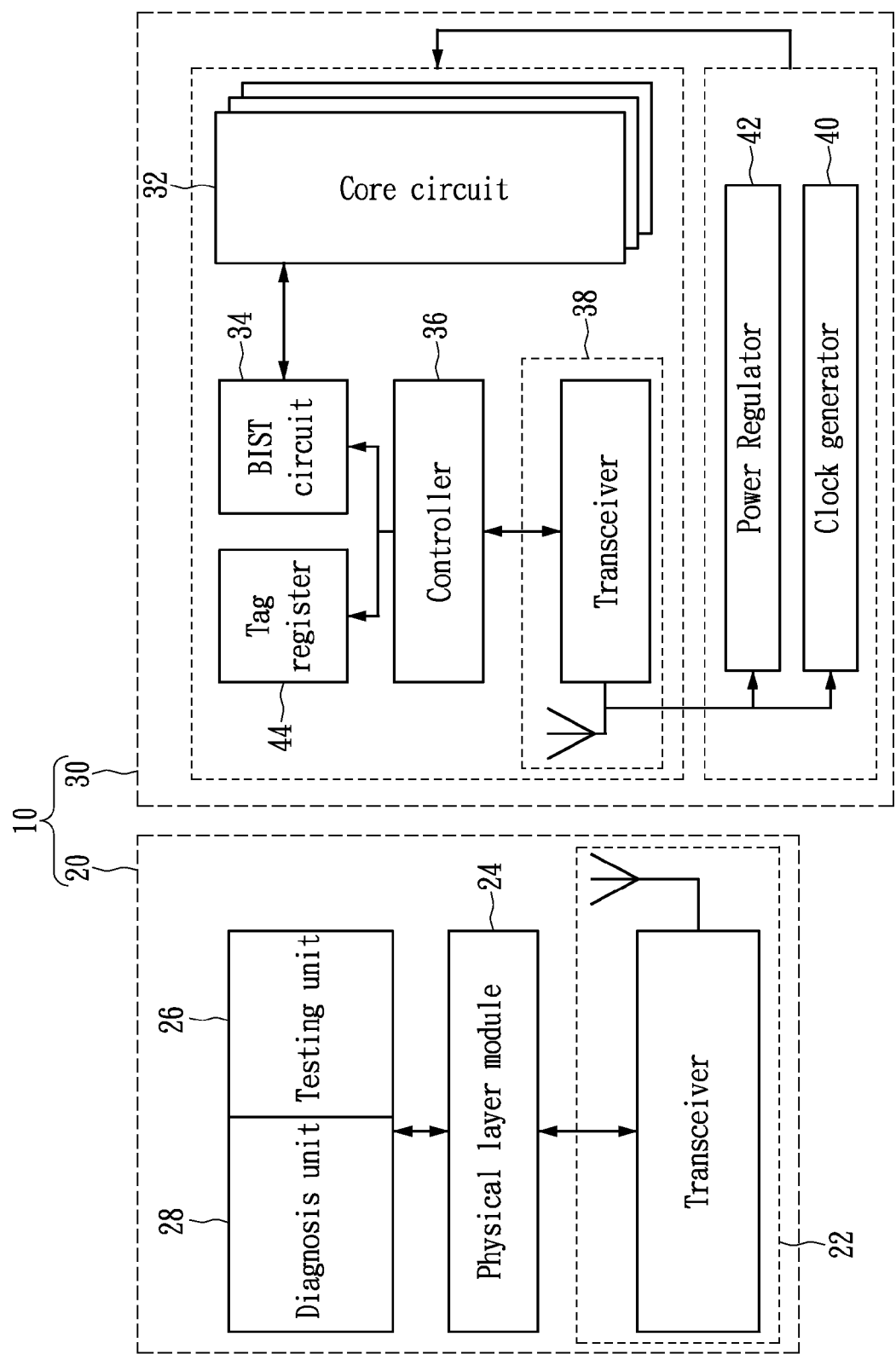
FIG. 1 illustrates a probing system for integrated circuit device according to one embodiment of the present invention.

FIG. 1 illustrates a probing system 10 for integrated circuit device according to embodiments of the present invention, in which testing data such as the probing signal and the tested electrical parameter is transmitted between a testing machine 20 and an integrated circuit device 30 in a wireless manner. The testing machine 20 comprises a first transceiving module 22, a physical layer module 24 electrically connected to the first transceiving module 22, a testing unit 26 electrically coupled to the physical layer module 24, and a diagnosis unit 28 electrically coupled to the physical layer module 24. The integrated circuit device 30 such as a system on chip (SOC) comprises a core circuit 32, a built-in self-test (BIST) circuit 34 electrically connected to the core circuit 32, a controller 36 configured to control the operation of the BIST circuit 34, and a second transceiving module 38 configured to exchange testing data with the first transceiving module 22. The first transceiving module 22 and the second transceiving module 32 each include a transceiver and an antenna.

The core circuit 32 may be a memory circuit, or a logic circuit, or an analog circuit or may be any combination of two of the above circuits. The core circuit 32 may also include a memory circuit, a logic circuit and an analog circuit. In addition, the inventor of the present application filed two Taiwanese patent applications, No. 088103352 and No. 090107845, disclosing the design technique of the BIST circuit 34. Preferably, the integrated circuit device 30 may further comprises a clock generator 40 electrically connected to the second transceiving module 38 and a power regulator 42 electrically connected to the second transceiving module 38, wherein the testing machine 20 transmits a radio frequency signal by the first transceiving module 22 and the second transceiving module 32 receives the radio frequency signal to drive the power regulator 42 to generate the operation power for the integrated circuit device 30. Further, the integrated circuit device 30 may includes a tag register 44 for storing the identification of the integrated circuit device 30.

During the electrical testing process, the testing machine 20 may transmit a radio frequency signal by the first transceiving module 22 and the second transceiving module 32 receives the radio frequency signal to drive the power regulator 42 to generate the operation power for the integrated circuit device 30. The testing unit 26 of the testing machine 20 may also set an identification to integrated circuit device 30 by the first transceiving module 22, and integrated circuit device 30 stores its own identification in the tag register 44. During the testing process, the testing unit 26 performs test operation by issuing an activation instruction transmitting to the second transceiving module 32 to activate the BIST circuit 34 to perform the electrical testing of the core circuit 32.

In one of the embodiment, may have a diagnosis unit 28 receives testing data transmitted from integrated circuit device 30 after the electrical testing is completed, and checks if the integrated circuit device 30 meets the specifications of the electrical properties and analyzes the failure cause of failed device. The physical layer module 24 control data signals transmit and receive operation.

Figure 2:
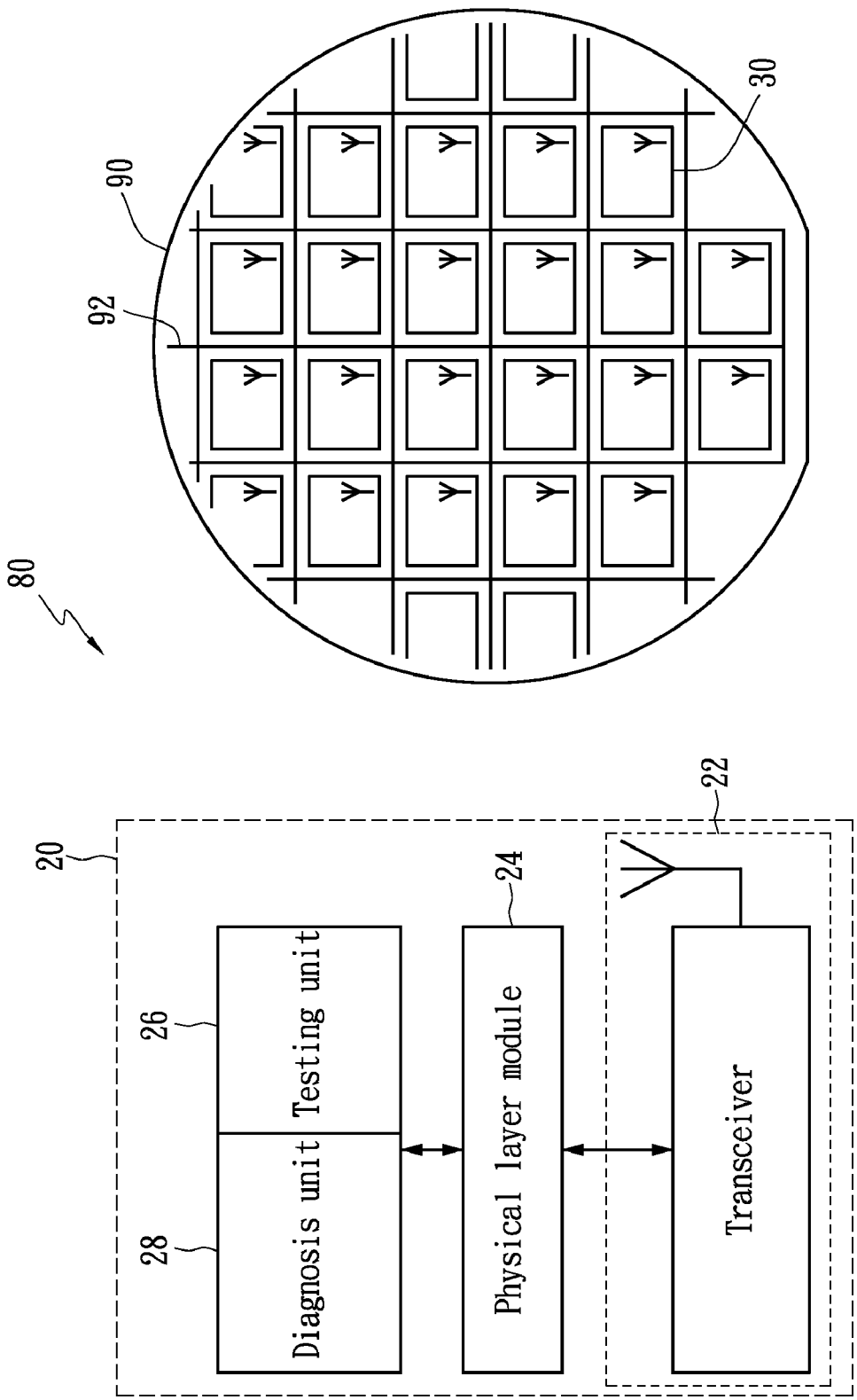
FIG. 2 illustrates a probing system for integrated circuit device according to another embodiment of the present invention.

FIG. 2 illustrates a probing system 80 for integrated circuit device according to embodiments of the present invention, which is applied to the electrical testing of a plurality of integrated circuit device 30 on a wafer. Particularly, the probing system 80 is applied to the electrical testing of the integrated circuit device 30 at a wafer level. In addition, the wafer 90 may include a power supply line 92 surrounding the integrated circuit device 30, and the integrated circuit device 30 can optionally acquire the operation power from the power supply line 92 rather than from the power generated by the power regulator 42 after receiving the radio frequency signal. Particularly, the power supply line 92 is positioned on the cutting lines of the wafer 90.

Figure 3:
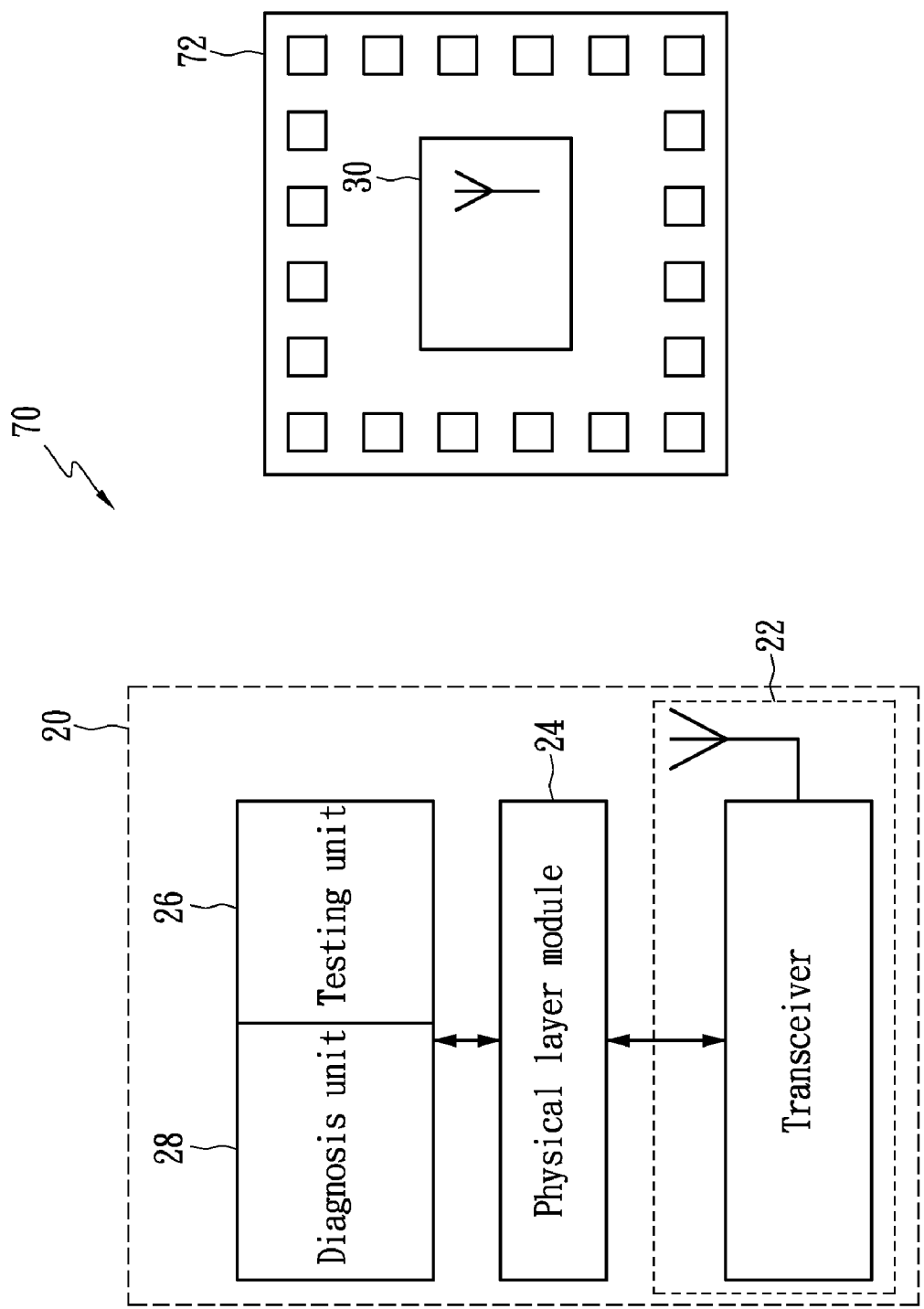
FIG. 3 illustrates a probing system for integrated circuit device according to another embodiment of the present invention.

FIG. 3 illustrates a probing system 70 for integrated circuit device according to embodiments of the present invention, which is applied to the final testing of an encapsulated die 72. As shown in FIG. 2, the wafer 90 is cut into a plurality of integrated circuit device 30, and those which meet electrical properties specifications are selected to perform the subsequent packaging process, while others that do not meet the specifications are discarded. The testing unit 26 transmits an activation instruction to the second transceiving module 32 to activate the BIST circuit 34 to perform the electrical testing of the core circuit 32, and the diagnosis unit 28 then accumulates testing data transmitted from each integrated circuit device 30 after the electrical testing is completed and checks if the integrated circuit device 30 meets the specifications of the electrical properties and analyzes the failure cause of any failed device.

Figure 4:
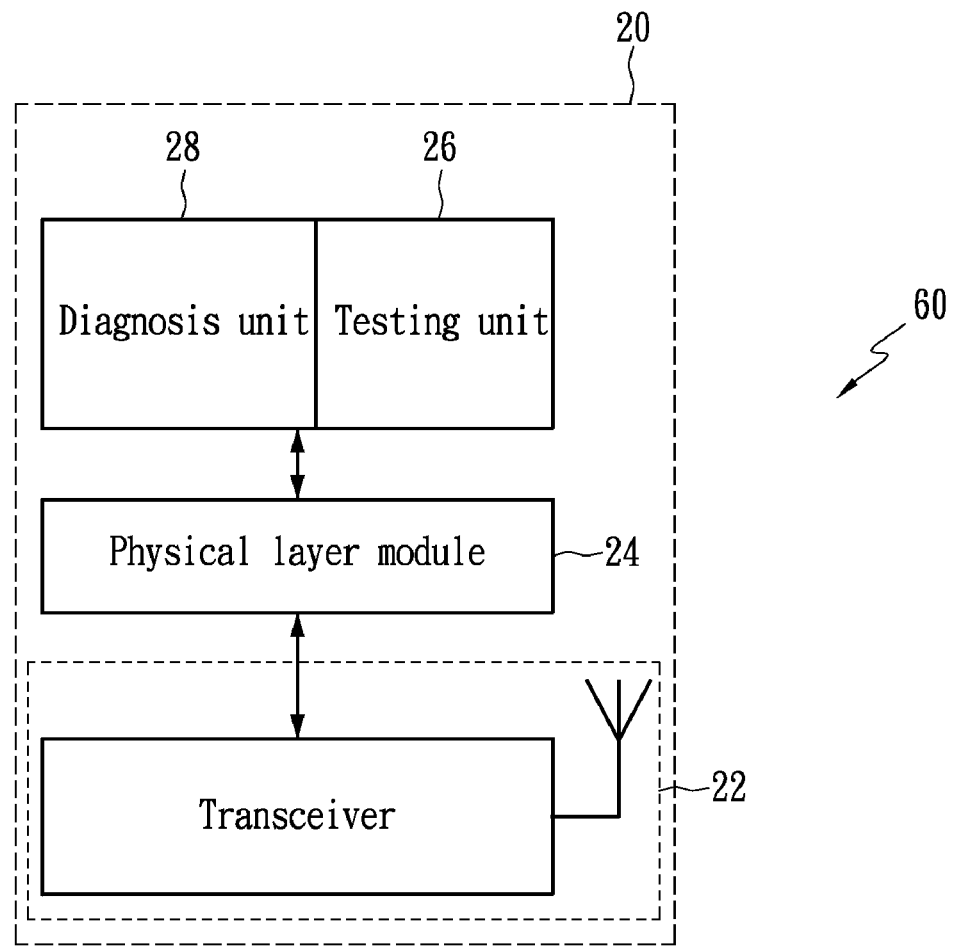
FIG. 4 illustrates a probing system for integrated circuit device according to another embodiment of the present invention.
Figure 4:
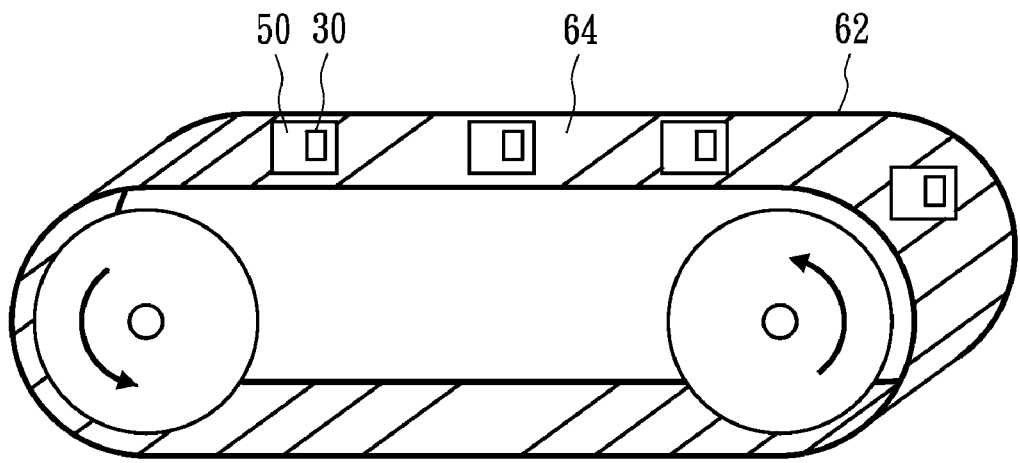

FIG. 4 illustrates a probing system 60 for integrated circuit device according to embodiments of the present invention. The testing machine 20 further comprises a conveying device 62 electrically connected to a power supply. The integrated circuit device 30 is positioned on circuit board 50, which is electrically connected to the power supply via the conveying device 62, and the integrated circuit device 30 acquires the operation power from the circuit board 50, i.e., from the conveying device 62 via the circuit board 50. The conveying device 62 can convey the circuit board 50 with the integrated circuit device 30 to a predetermined position 64, where the testing unit 26 transmits an activation instruction to the second transceiving module 32 to activate the BIST circuit 34 to perform the electrical testing of the core circuit 32. Subsequently, the diagnosis unit 28 can accumulate testing data transmitted from each integrated circuit device 30 after the electrical testing is completed and checks if the integrated circuit device 30 meets the specifications of the electrical properties and analyze the failure cause of any failed device.

The probing system 10 shown in FIG. 1 could be modified by changing arrangements of the internal modules or devices, so as to increase the flexibility for various applications.

Figure 5:
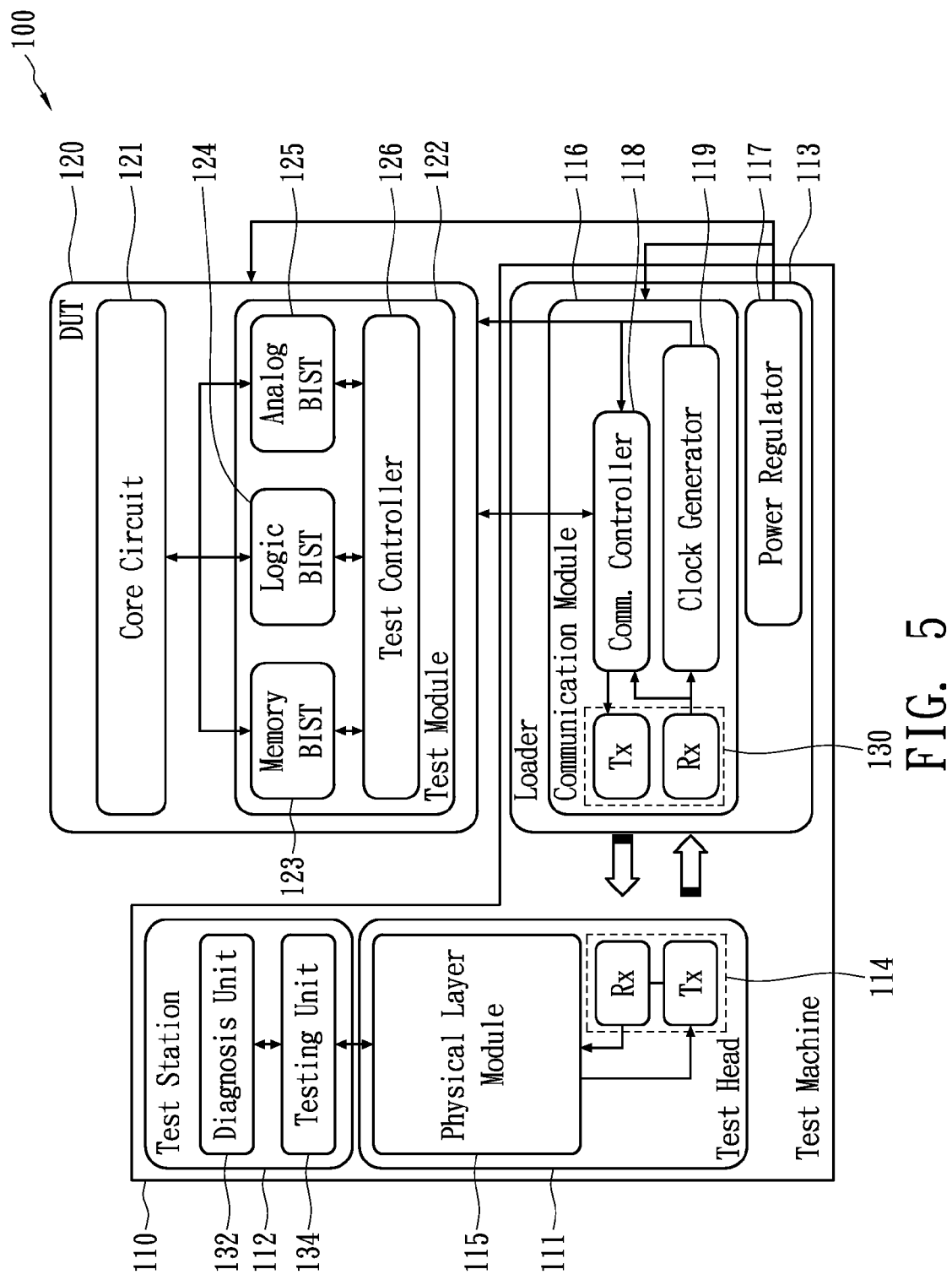
FIG. 5 illustrates a probing system for integrated circuit device according to another embodiment of the present invention.

FIG. 5 illustrates a probing system 100 for integrated circuit device according to embodiments of the present invention. The probing system 100 comprises a test machine 110 and an integrated circuit device 120 under test (DUT). The test machine 110 comprises a test head 111, a test station 112 and a loader 113. The test station 112 comprises a diagnosis unit 132 and a testing unit 134, wherein the diagnosis unit 132 is an optional unit to provide diagnosis function. The test head 111 comprises a physical layer module 115 and a first transceiving module 114 coupled to the physical layer module 115. The physical layer module 115 is coupled to the testing unit 134, and the diagnosis unit 132 is coupled to the testing unit 134. The loader 113 is configured to carry the DUT 120, and comprises a communication module 116 and a power regulator 117. The communication module 116 comprises a second transceiving module 130, a communication controller 118.

The communication controller 118 is electrically coupled to the second transceiving module 130, and the clock generator 119 is electrically coupled to the second transceiving module 130, the communication controller 118 and the DUT 120 for providing clock signals. The DUT 120 such as a system on chip (SOC) comprises a core circuit 121 and a test module 122. In one embodiment, the test module 122 comprises a memory BIST (built-in self-test circuit) 123, a logic BIST 124, an analog BIST 125 and a test controller 126. In another embodiment, the test module 122 may comprise a memory BIST (built-in self-test circuit) 123, or a logic BIST 124, or an analog BIST 125 only or it may comprise any combination of two of the above BIST circuits connecting to the test controller 126.

The DUT 120 may be positioned on the loader 113, and acquires the operation power from the loader 113. Moreover, the DUT 120 may be transported to a predetermined position by the conveying device. In one embodiment, the core circuit 121 may comprises a memory circuit, a logic circuit and an analog circuit. The core circuit 121 is coupled to the memory BIST 123, the logic BIST 124 and the analog BIST 125, and the operations of these BISTs are controlled by the test controller 126. In another embodiment, the core circuit 121 may be a memory circuit, or a logic circuit or an analog circuit only, or it may also be any combination of two of the above circuits. The core circuit 121 then is coupled to the corresponding memory BIST 123, the logic BIST 124 or the analog BIST 125 Testing data such as the probing signal and the tested electrical parameter is transmitted between the test head 111 and the loader 113 through the first transceiving module 114 and the second transceiving module 130 in a wireless manner. In other words, the first transceiving module 114 and the second transceiving module 130 exchange testing data with each other. The physical layer module 115 and communication controller 118 controls the transmitting and receiving of data signals respectively.

In an embodiment, the first transceiving module 114 and the second transceiving module 130 each include a transceiver and an antenna. The power regulator 117 is electrically connected to the communication module 116 and the DUT 120. The testing machine 110 transmits a radio frequency signal by the first transceiving module 114, and the second transceiving module 130 receives the radio frequency signal to drive the power regulator 117 to generate the operation power for the DUT 120.

Figure 6:
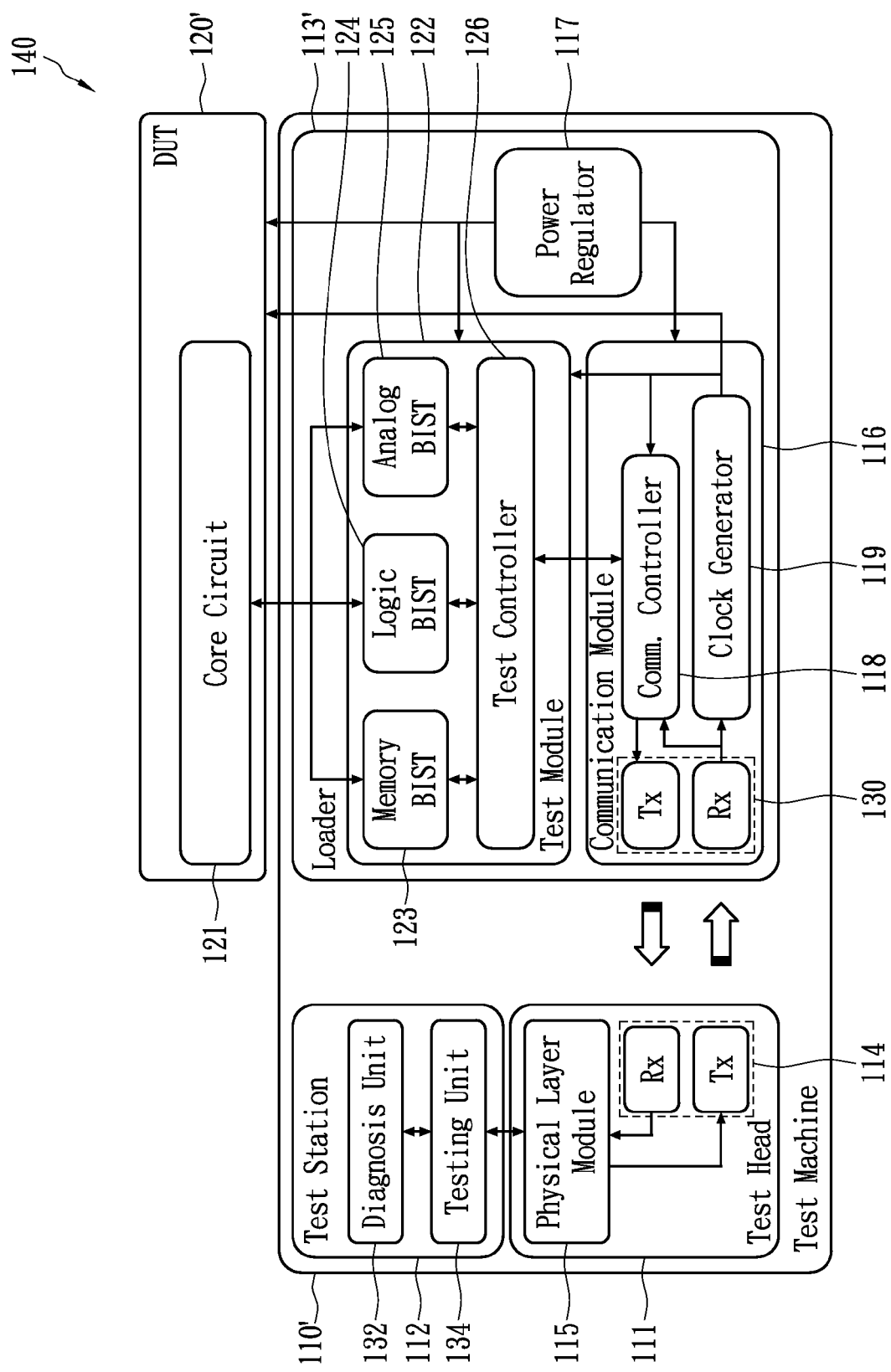
FIG. 6 illustrates a probing system for integrated circuit device according to another embodiment of the present invention.

FIG. 6 illustrates a probing system 140 for integrated circuit device according to embodiments of the present invention. In comparison with the system 100 of FIG. 5, the test module 122 is changed to be included in a loader 113' of a test machine 110'. Consequently, a DUT 120' comprises the core circuit 121 only, and is easy to be manufactured. The power regulator is electrically connected to the communication module 116, the test module 122 and the DUT 120'.

Figure 7:
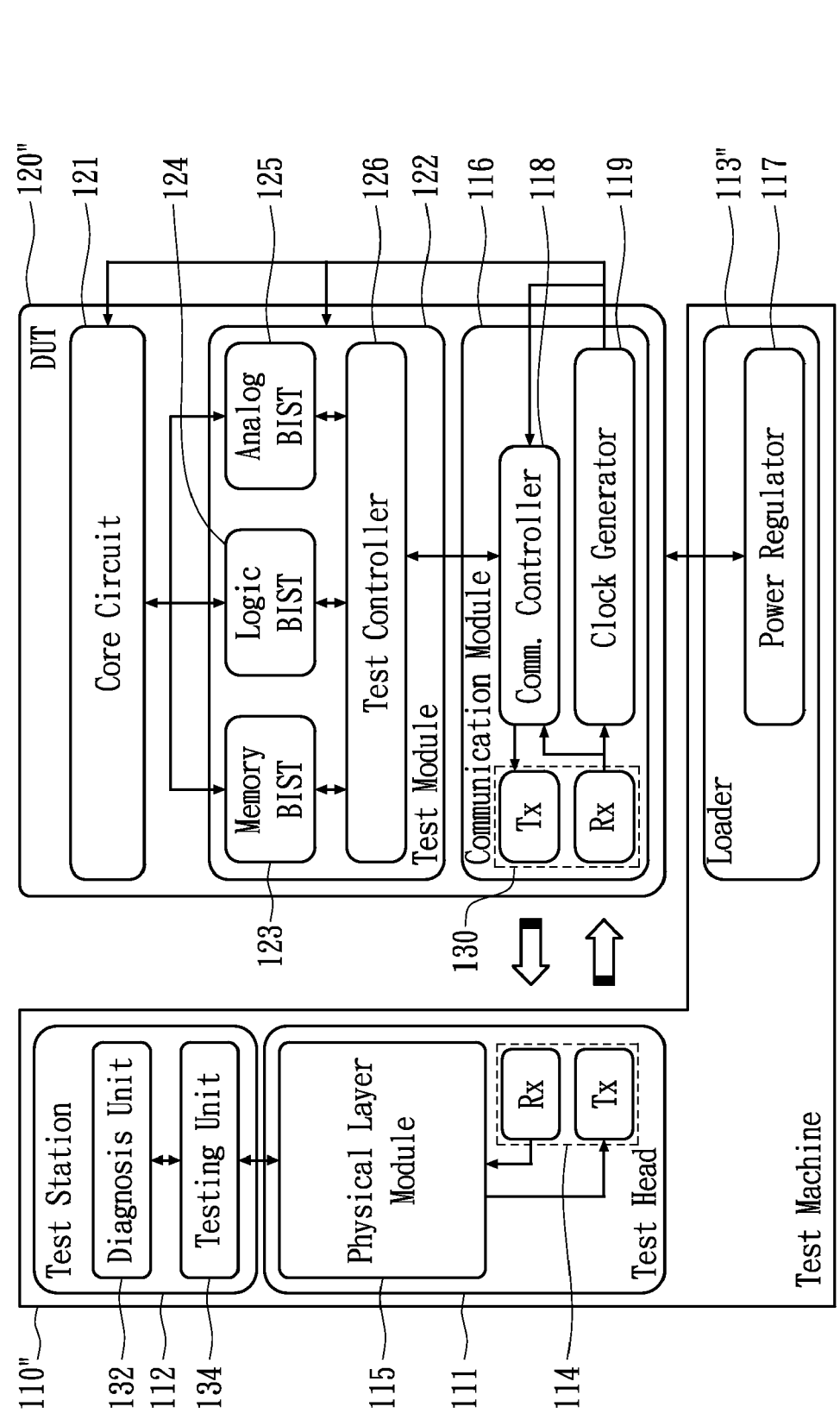
FIG. 7 illustrates a probing system for integrated circuit device according to another embodiment of the present invention.

FIG. 7 illustrates a probing system 150 for integrated circuit device according to embodiments of the present invention. In comparison with FIG. 5, the communication module 116 is changed to be included in a DUT 120". Consequently, the DUT 120" comprises the core circuit 121, the test module 122 and the communication module 116, and a loader 113" of a test machine 110" contains the power regulator 117 only. The power regulator 117 is electrically connected to the DUT 120".

Figure 8:
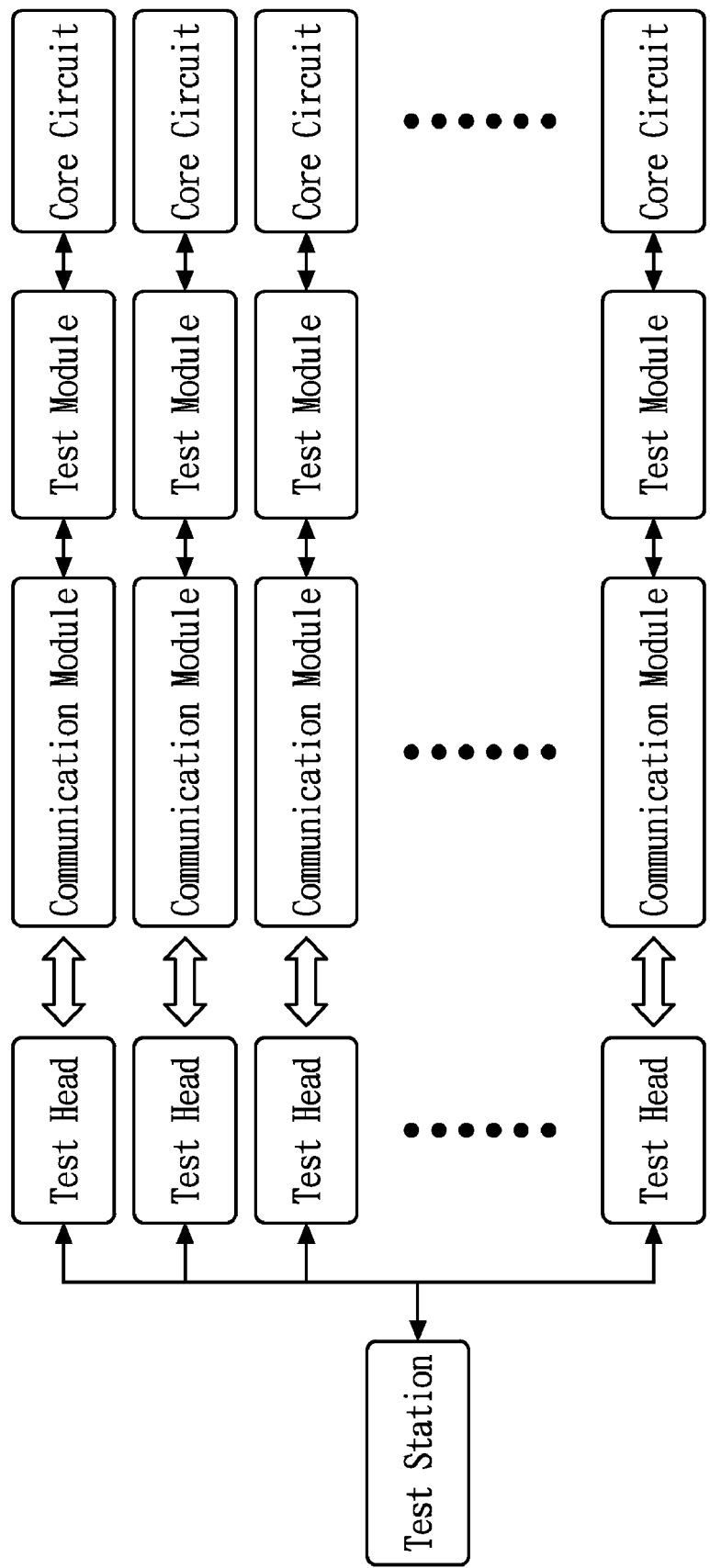
FIGS. 8 and 9 illustrate signal transmissions of a probing system for integrated circuit device according to embodiments of the present invention.

FIG. 8 illustrates signal transmission for a probing system capable of testing a plurality of DUTs in accordance with embodiments of the present invention. The test machine comprises a test station and a plurality of test heads and each test head is corresponding to a communication module. The testing data such as the probing signal and the tested electrical parameter is transmitted between the test heads and the communication modules in wireless manner. That is, the communication is conducted by a one-to-one manner. Each communication module is electrically coupled to a test module that is connected to a core circuit. Because there are many test heads, the testing efficiency can be improved significantly.

Figure 9:
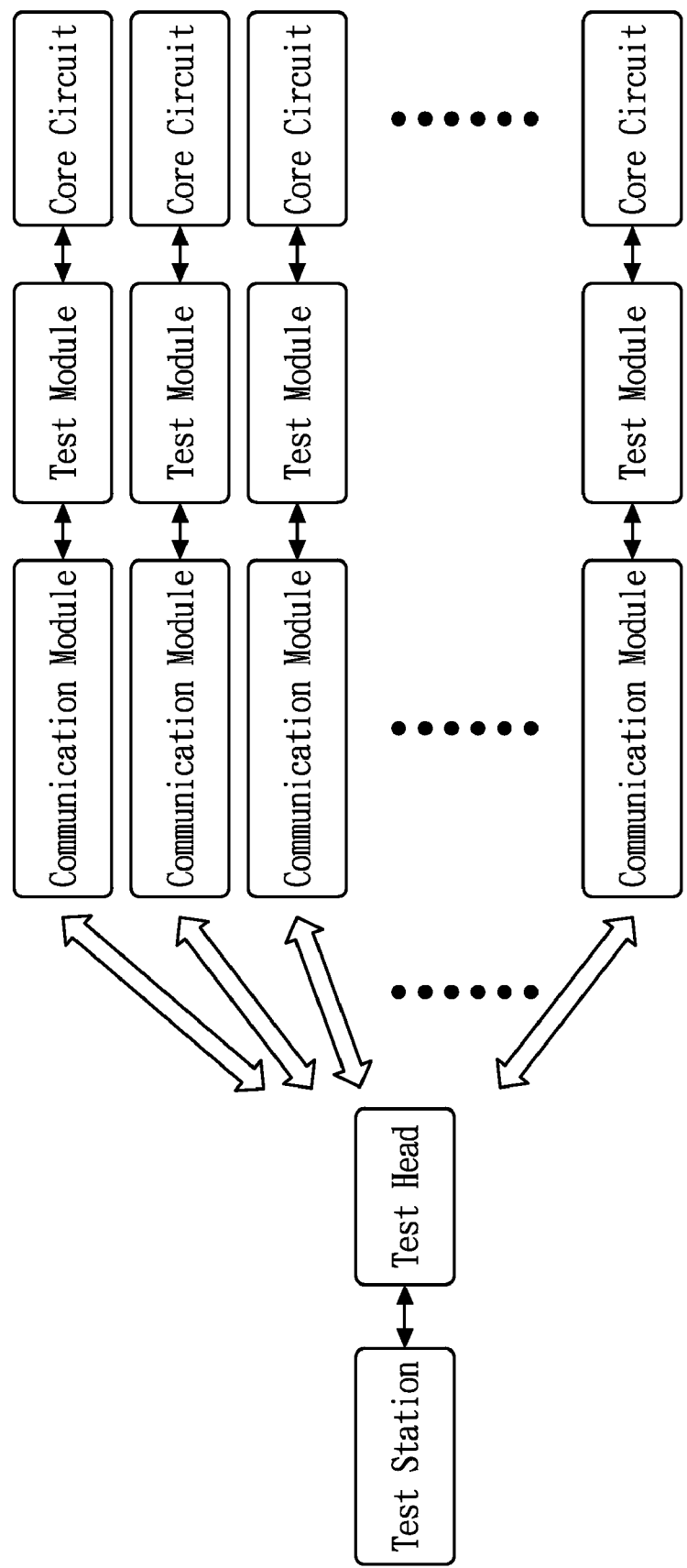

FIG. 9 illustrates signal transmission for a probing system capable of testing a plurality of DUTs in accordance with embodiments of the present invention. The test machine comprises a test station and a test head, and the test head is corresponding to a plurality of communication modules. Testing data such as the probing signal and the tested electrical parameter is transmitted between the test head and a plurality of communication modules in wireless manner. That is, the communication is conducted by a one-to-multiple manner. Each communication module is electrically coupled to a test module that is electrically connected to a core circuit.

Figure 10:
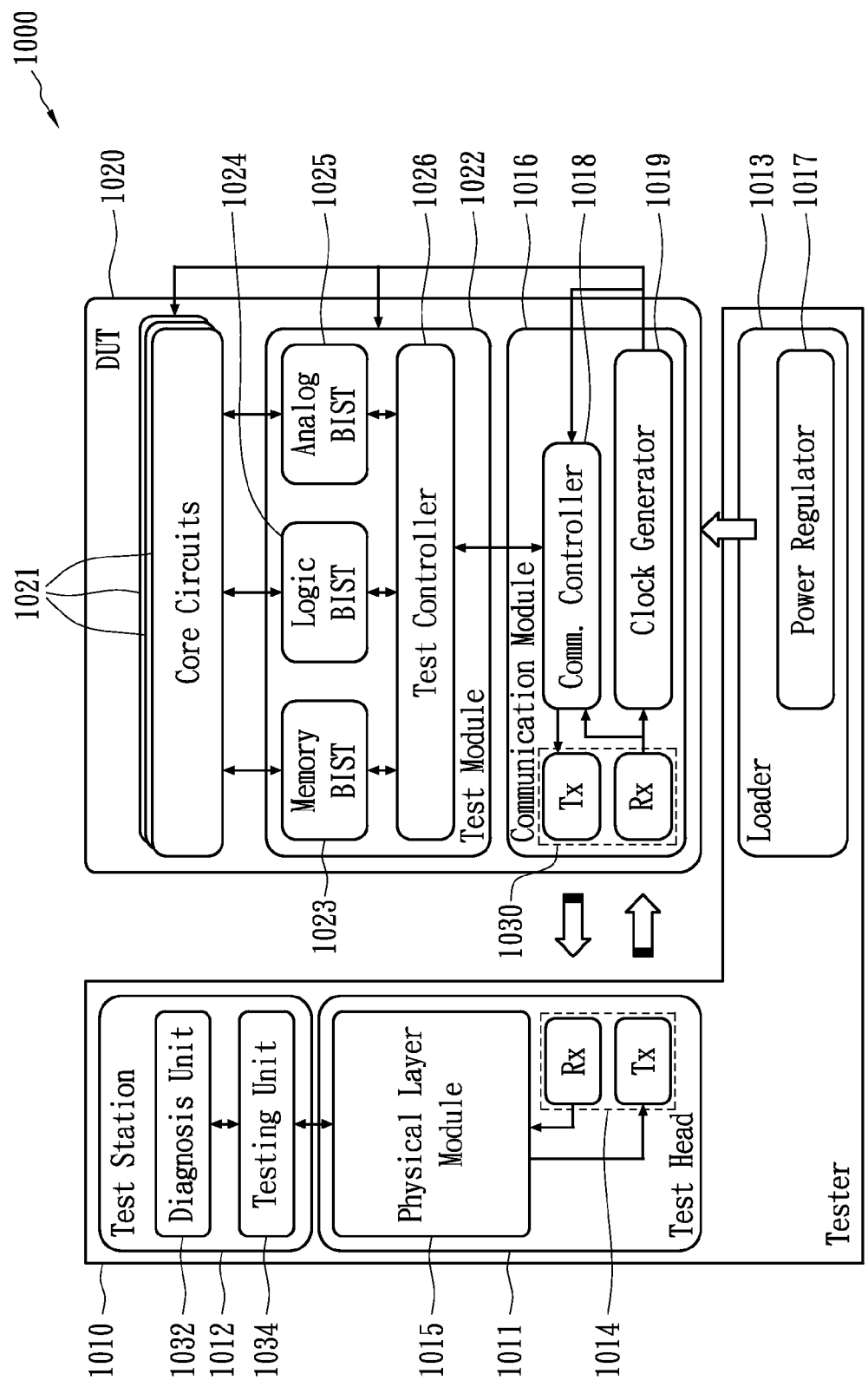
FIG. 10 illustrates a probing system for integrated circuit device according to another embodiment of the present invention.

FIG. 10 illustrates a probing system 1000 for integrated circuit device according to embodiments of the present invention. The probing system 1000 comprises a tester 1010 and an integrated circuit device 1020 under test (DUT). The tester 1010 comprises a test head 1011, a test station 1012 and a loader 1013. The test station 1012 comprises a diagnosis unit 1032 and a testing unit 1034, wherein the diagnosis unit 1032 is an optional unit to provide diagnosis function. The test head 1011 comprises a physical layer module 1015 and a first transceiving module 1014 coupled to the physical layer module 1015. The physical layer module 1015 is coupled to the testing unit 1034, and the diagnosis unit 1032 is coupled to the testing unit 1034. The loader 1013 is configured to carry the DUT 1020, and comprises a power regulator 1017.

The DUT 1020, utilizing a 3D packaging technique, comprises a communication module 1016, a test module 1022 and a plurality of core circuits 1021, wherein the communication module 1016, the test module 1022 and the plurality of core circuit 1021 are respectively manufactured in a die. The communication module 1016 comprises a communication controller 1018, a clock generator 1019 and a second transceiving module 1030. The communication controller 1018 is electrically coupled to the second transceiving module 1030, and the clock generator 1019 is electrically coupled to the second transceiving module 1030, the communication controller 1018 and the DUT 1020 for providing clock signals. In one embodiment, the test module 1022 comprises a memory BIST (built-in self-test circuit) 1023, a logic BIST 1024, an analog BIST 1025 and a test controller 1026. In another embodiment, the test module 1022 may comprise a memory BIST (built-in self-test circuit) 1023, or a logic BIST 1024, or an analog BIST 1025 only or it may comprise any combination of two of the above BIST circuits connected to the test controller 1026.

The DUT 1020 may be positioned on the loader 1013, and acquires the operation power from the loader 1013. Moreover, the DUT 1020 may be transported to a predetermined position by the conveying device. In one embodiment, the plurality of core circuits 1021 may comprise memory circuits, logic circuits and analog circuits. The plurality of core circuits 1021 are coupled to the memory BIST 1023, the logic BIST 1024 and the analog BIST 1025, and the test controller 1026 controls the operations of these BISTs. In another embodiment, the plurality of core circuits 1021 may be memory circuits, or logic circuits or analog circuits only, or it may also be combination of any two of the above circuits. The plurality of core circuits 1021 are coupled to the corresponding memory BIST 1023, the logic BIST 1024 or the analog BIST 1025. Testing data such as the probing signal and the tested electrical parameter is transmitted between the test head 1011 and the DUT 1020 through the first transceiving module 1014 and the second transceiving module 1030 in a wireless manner. In other words, the first transceiving module 1014 and the second transceiving module 1030 exchange testing data with each other. The physical layer module 1015 and the communication controller 1018 control the transmitting and receiving of data signals, respectively.

In an embodiment, both the first transceiving module 1014 and the second transceiving module 1030 include a transceiver and an antenna. The power regulator 1017 is electrically connected to the communication module 1016 and the DUT 1020. The tester 1010 transmits a radio frequency signal by the first transceiving module 1014, and the second transceiving module 1030 receives the radio frequency signal to drive the power regulator 1017 to generate the operation power for the DUT 1020.

Figure 11:
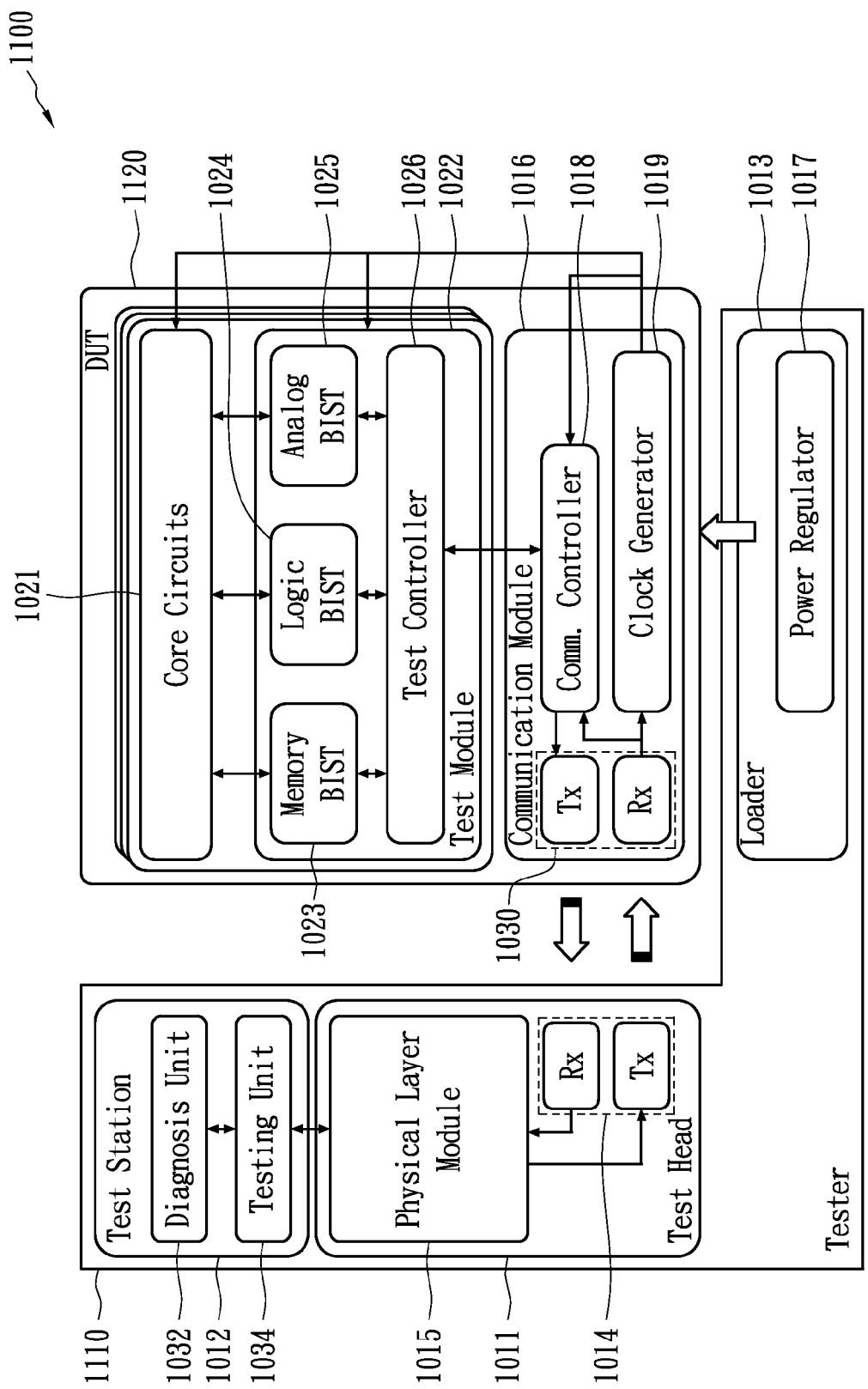
FIG. 11 illustrates a probing system for integrated circuit device according to another embodiment of the present invention.

FIG. 11 illustrates a probing system 1100 for integrated circuit device according to embodiments of the present invention. The probing system 1100 comprises a tester 1110 and a DUT 1120. Comparing with the probing system 1000 shown in FIG. 10, the DUT 1120, utilizing a 3D packaging technique, comprises a communication module 1016, a plurality of test modules 1022 and a plurality of core circuits 1021, wherein each core circuit 1021 is manufactured along with a test module 1022 in one die, and the communication module 1016 is manufactured in another die different from the dies of the plurality of core circuits 1021.

Figure 12:
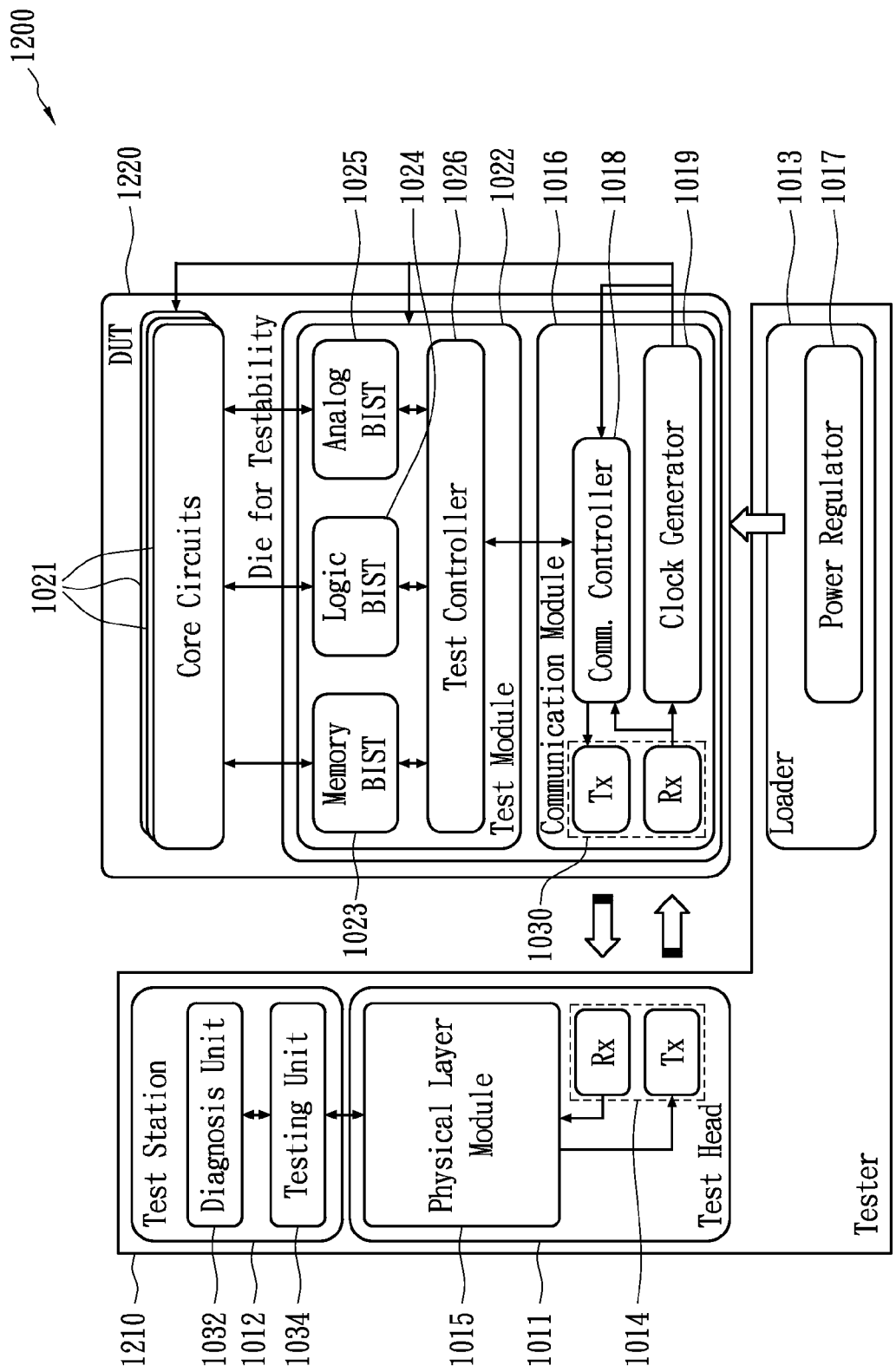
FIG. 12 illustrates a probing system for integrated circuit device according to another embodiment of the present invention.

FIG. 12 illustrates a probing system 1200 for integrated circuit device according to embodiments of the present invention. The probing system 1200 comprises a tester 1210 and a DUT 1220. Comparing with the probing system 1000 shown in FIG. 10, the DUT 1220, utilizing a 3D packaging technique, comprises a communication module 1016, a test module 1022 and a plurality of core circuits 1021, wherein each core circuit 1021 is manufactured in one die, and the communication module 1016 is manufactured along with the test module 1022 in another die different from the dies of the plurality of core circuits 1021.

Figure 13:
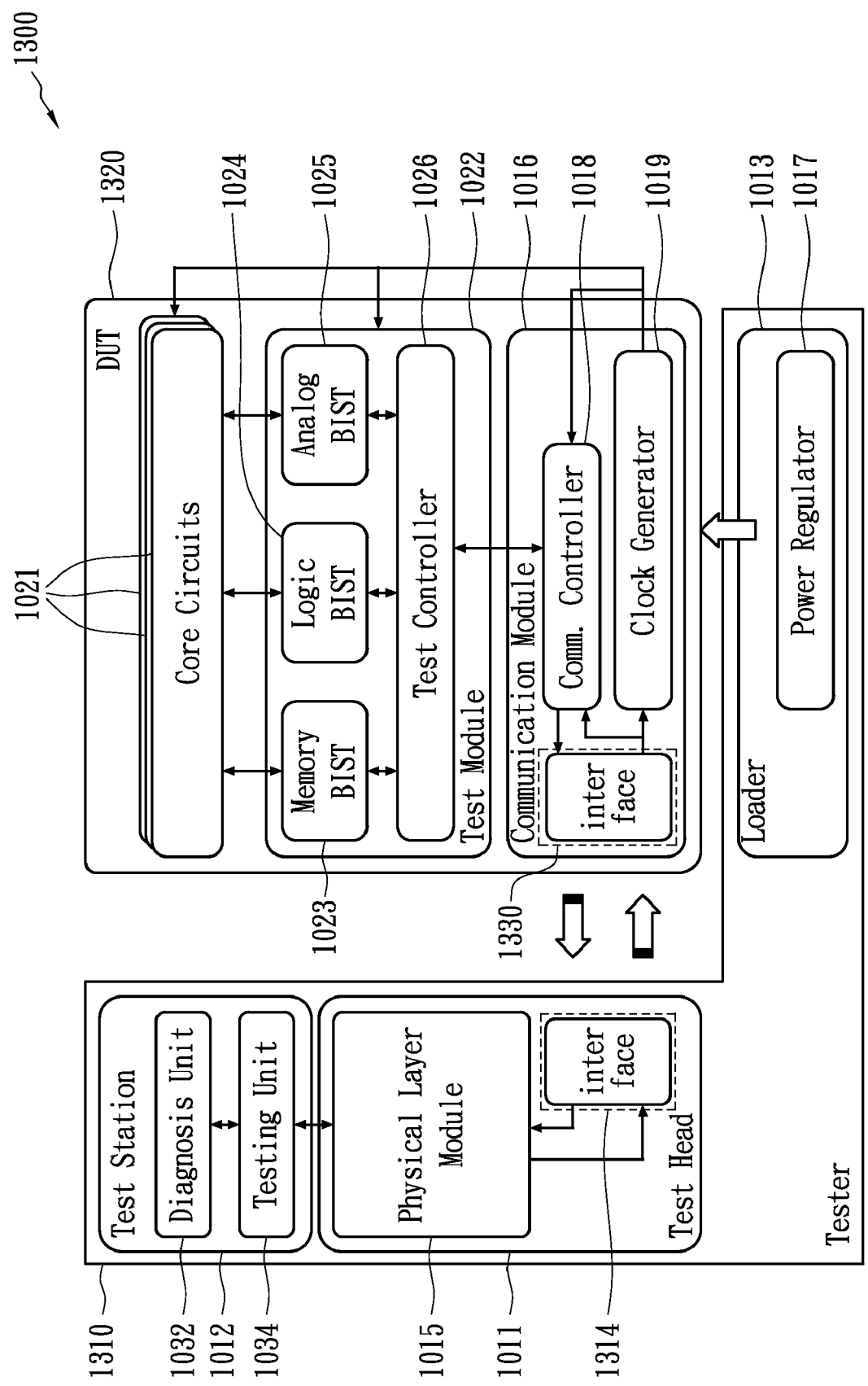
FIG. 13 illustrates a probing system for integrated circuit device according to another embodiment of the present invention.

FIG. 13 illustrates a probing system 1300 for integrated circuit device according to embodiments of the present invention. The probing system 1300 comprises a tester 1310 and a DUT 1320. Comparing with the probing system 1000 shown in FIG. 10, the first and the second transceiving module 1314 and 1330 communicated with each other in a different manner other than wireless technique. In one embodiment of the present invention, the first and the second transceiving module 1314 and 1330 utilize a wired communication technique. In another embodiment of the present invention, the first and the second transceiving module 1314 and 1330 utilize an optical communication technique.

The prior art uses a mechanical element, i.e., the tip, to transmit testing data, and therefore the overall time accuracy cannot catch up with the increasing operation speed of integrated circuit device. Conversely, the present probing system includes a transceiving module in the integrated circuit device to transmit testing data in a different manner; therefore the overall time accuracy is substantially the same as that of the integrated circuit device. In other words, the overall time accuracy of the present invention is not restricted by mechanical elements, and therefore can be applied to the electrical testing of high-speed integrated circuit device. Particularly, the present probing system for integrated circuit devices may also diagnose the failure causes of a failed device in addition to performing electrical testing. In addition, the application of the present probing system is not limited to integrated circuit devices with only one die, but rather suited for integrated circuit devices manufactured in 3D packaging technique.

The above-described embodiments of the present invention are intended to be illustrative only. Numerous alternative embodiments may be devised by those skilled in the art without departing from the scope of the following claims.

What is claimed is:

1. A probing system for integrated circuit device, comprising:

a test head having a first transceiving module;

a test station having a test unit coupled to the test head to perform test operation; and an integrated circuit device comprising a communication module, a plurality of core circuits being tested and at least one test module;

wherein the communication module having a second transceiving module configured to exchange data with the first transceiving module;

wherein each core circuit is manufactured in one die;

wherein each test module has a self-test circuit coupled to the plurality of core circuits and the communication module for performing self-testing to the plurality of core circuits;

wherein the communication module, the plurality of core circuits and the test module are packaged in one package.

2. The probing system for integrated circuit device of claim 1, wherein the communication module and the test module are respectively manufactured in two dies different from the dies of the plurality of core circuits.

3. The probing system for integrated circuit device of claim 1, wherein each core circuit is manufactured along with a test module in one die, and the communication module is manufactured in another die different from the dies of the plurality of core circuits.

4. The probing system for integrated circuit device of claim 1, wherein the communication module and the test module are manufactured together in another die different from the dies of the plurality of core circuits.

5. The probing system for integrated circuit device of claim 1, wherein the communication module further comprises a clock generator coupled to the second transceiving module.

6. The probing system for integrated circuit device of claim 5, wherein the communication module further comprises a communication controller coupled to the second transceiving module and the clock generator.

7. The probing system for integrated circuit device of claim 5, wherein the clock generator is electrically coupled to the test module.

8. The probing system for integrated circuit device of claim 1, further comprising a power regulator providing power to the integrated circuit device, wherein the second transceiving module receives a signal transmitted by the first transceiving module to drive the power regulator to generate operation power.

9. The probing system for integrated circuit device of claim 8, wherein the integrated circuit device is positioned on a loader having the power regulator, and acquires operation power from the loader.

10. The probing system for integrated circuit device of claim 1, wherein the test head further comprises a physical layer module coupled to the first transceiving module.

11. The probing system for integrated circuit device of claim 1, wherein the test station further comprises a diagnosis unit coupled to the testing unit.

12. The probing system for integrated circuit device of claim 1, wherein the self-test circuit is a memory self-test circuit.

13. The probing system for integrated circuit device of claim 1, wherein the self-test circuit is a logic self-test circuit.

14. The probing system for integrated circuit device of claim 1, wherein the self-test circuit is an analog self-test circuit.

15. The probing system for integrated circuit device of claim 1, wherein the first transceiving module exchanges data with the second transceiving module in a wireless manner.

16. The probing system for integrated circuit device of claim 1, wherein the first transceiving module exchanges data with the second transceiving module in a wired manner.

17. The probing system for integrated circuit device of claim 1, wherein the first transceiving module exchanges data with the second transceiving module in an optical manner.

* * * * *